United States Patent [19]
Nakai

[11] Patent Number: 5,188,058
[45] Date of Patent: Feb. 23, 1993

[54] UNIFORM GAS FLOW CVD APPARATUS
[75] Inventor: Satoshi Nakai, Kawasaki, Japan
[73] Assignee: Fujitsu Limited, Kawasaki, Japan
[21] Appl. No.: 902,661
[22] Filed: Jun. 22, 1992
[30] Foreign Application Priority Data
  Jun. 20, 1991 [JP] Japan ................. 3-148755
[51] Int. Cl.⁵ .................................. C23C 16/46
[52] U.S. Cl. ........................... 118/719; 118/725
[58] Field of Search ...................... 118/719, 725
[56] References Cited
  U.S. PATENT DOCUMENTS
  4,709,655 12/1987 Van Mastrigt ............... 118/719
  5,094,885 7/1988 Selbrede ...................... 118/719
  FOREIGN PATENT DOCUMENTS
  62-154617 7/1987 Japan .

Primary Examiner—Richard Bueker
Attorney, Agent, or Firm—Staas & Halsey

[57] ABSTRACT

A CVD apparatus comprising a reaction chamber in which reaction gas is supplied from above the substrate supported on the susceptor plate and exhausted uniformly from a plurality of circumferentially spaced gas exits, and infrared light heats the substrate from below the substrate via an infrared light transparent window arranged between the source of infrared light and the susceptor plate. A second infrared light transparent window with a central opening is arranged between the first infrared light transparent window and the susceptor plate. Nitrogen gas or an inert gas is supplied from a portion between the first and second infrared light transparent windows and flows through a plurality of circumferentially spaced gas passages arranged at the juncture of the susceptor plate and the peripheral wall of the reaction chamber to the gas exits. The gas passages are coordinated with the gas exits so that the flow of the reaction gas is less disturbed by the flow of the second gas.

12 Claims, 4 Drawing Sheets

UNIFORM GAS FLOW CVD APPARATUS

BACKGROUND OF THE INVENTION

1. Field of the Invention

The present invention relates to a CVD apparatus, and in particular, it relates to a CVD apparatus in which a uniform flow of reaction gas is established by exhausting the reaction gas from an equidistantly arranged gas exit and by minimizing a turbulence of the reaction gas to obtain a thin film of an averaged thickness to be deposited on a substrate.

2. Description of the Related Art

CVD apparatuses have been used in manufacturing semiconductor devices or else for depositing a thin film of, for example, an oxide or a nitride on the surface of a semiconductor substrate. In manufacturing semiconductor devices, it is desired to reduce a variation in the thickness of the deposited thin film.

FIGS. 9 to 11 of the attached drawings show a conventional rapid thermal CVD apparatus. FIG. 9 is a longitudinal cross-sectional view of the CVD apparatus, FIG. 10 is a cross-sectional view of the CVD apparatus along the lines b—b of FIG. 9, and FIG. 11 is a cross-sectional view of the CVD apparatus along the lines c—c of FIG. 9.

The CVD apparatus comprises a reaction chamber 1, a susceptor plate 3 fixed in the reaction chamber 1 for supporting a substrate 2 thereon and having an opening 3a at a substrate supporting region, and a reaction gas supply inlet 4 in the form of a shower nozzle for blowing a reaction gas from above the substrate 2 supported on the susceptor plate 3. Also, a source of infrared light 5 for heating the substrate 2 is arranged below the susceptor plate and an infrared light transparent window 6 is arranged between the source of infrared light 5 and the susceptor plate 3 for separating the reaction chamber 1 from an environment.

Also, a plurality of gas exits 7 are arranged circumferentially and equidistantly in the peripheral wall in the reaction chamber 1 at a level just above the susceptor plate 3 so that the reaction gas is exhausted uniformly and radially from the gas exists 7. A second gas supply inlet 8 for supplying a second gas such as nitrogen or an inert gas in the reaction chamber 1 is arranged between the susceptor plate 3 and the infrared light transparent window 6, and a second gas supply exit 9 is arranged at the same level as the second gas supply inlet 8. Accordingly, the reaction gas flows into the reaction chamber 1 above the susceptor plate 3 and the second gas flows into the reaction chamber 1 below the susceptor plate 3 independently of the reaction gas. However, there is an opening 10 in the peripheral wall of the reaction chamber 1; the opening 10 being connected to a loadlock chamber 12 via a gate valve 11 for inserting the substrate 2 in the reaction chamber 1 and discharging the substrate 2 from the reaction chamber 1. The opening 10 vertically extends from a portion above the susceptor plate 3 to a portion below the susceptor plate 3.

It is possible to deposit a thin film on the substrate 2 by maintaining the reaction chamber 1 at a vacuum level, heating the substrate 2 by the source of infrared light 5 and blowing the reaction gas to the substrate 2 from the reaction gas supply inlet 4. An undesirable reaction product may be deposited on the lower surface of the substrate 2 or the reaction gas may contaminate the infrared light transparent window 6 if the reaction gas enters the lower area of the reaction chamber 1 below the susceptor plate 3, and accordingly, the second gas flows in the lower area of the reaction chamber 1 below the susceptor plate 3 to prevent the reaction gas from leaking into the lower area beyond the susceptor plate 3 via a possible gap between the substrate 2 and the susceptor plate 3 and via the opening 10.

It is intended that the reaction gas flows uniformly from the reaction gas supply inlet 4 to the peripheral gas exits 7 to obtain a thin film of average thickness to be deposited on the substrate 2. However, the second gas, which does not serve the reaction, flows into the upper area of the reaction chamber 1 above the susceptor plate 3 via the opening 10, disturbing the intended uniform flow of the reaction gas and resulting in a less than average thickness of film deposited.

SUMMARY OF THE INVENTION

The object of the present invention is to solve the above described problem and provide a CVD apparatus in which a uniform flow of reaction gas is established by exhausting the reaction gas from an equidistantly arranged gas exit and by minimizing turbulence of the reaction gas to obtain a thin film of average thickness to be deposited on a substrate.

According to the present invention, there is provided a CVD apparatus comprising a reaction chamber having an axis and a peripheral wall around the axis, a susceptor plate extending perpendicular to the axis in the reaction chamber and attached to the peripheral wall for supporting a substrate to be treated, first gas supply means for supplying a first gas in the reaction chamber from above the substrate supported on the susceptor plate, a source of infrared light for heating the substrate from below the substrate supported on the susceptor plate, an infrared light transparent window arranged between the source of infrared light and the an environment, a plurality of circumferentially spaced gas exits arranged in the peripheral wall in the reaction chamber at a level so that the first gas is exhausted uniformly from the gas exits, a second gas supply means for supplying a second gas in the reaction chamber below the susceptor plate, and a plurality of circumferentially spaced gas passages arranged at the juncture of the susceptor plate and the peripheral wall of the reaction chamber for allowing the second gas to flow from a portion of the reaction chamber below the susceptor plate to the gas exits through the gas passages, and coordinated with the gas exits so that the flow of the first gas is less disturbed by the flow of the second gas.

With this arrangement, the second gas flows from a portion of the reaction chamber below the susceptor plate to the gas exits above the susceptor plate through the gas passages that are coordinated with the gas exits so that the flow of the first gas acting on the substrate is less disturbed by the flow of the second gas. Therefore, the uniform flow of the first gas is maintained to obtain a thin film of average thickness to be deposited on a substrate.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENT

Figure 1:
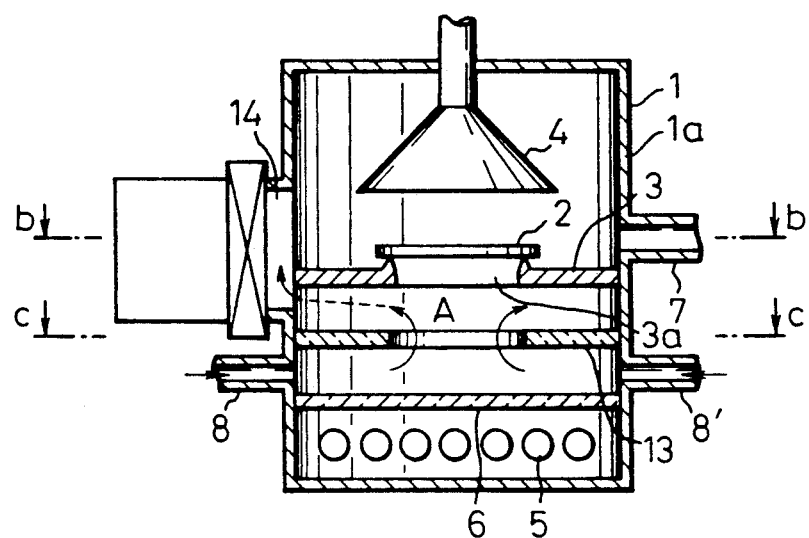
FIG. 1 is a longitudinal cross-sectional view of the CVD apparatus according to the first embodiment of the present invention.
Figure 2:
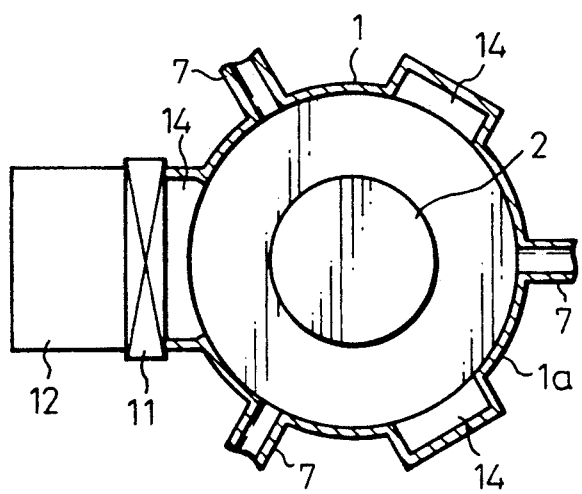
FIG. 2 is a cross-sectional view of the CVD apparatus along the lines b—b of FIG. 1.
Figure 3:
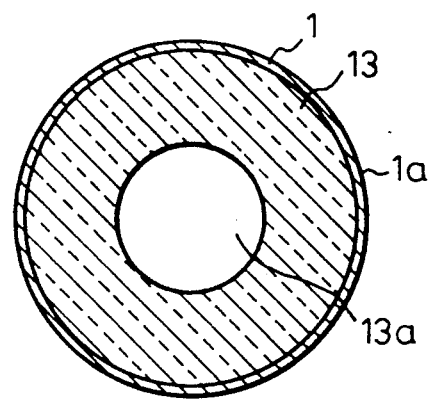
FIG. 3 is a cross-sectional view of the CVD apparatus along the lines c—c of FIG. 1.

FIGS. 1 to 3 show a CVD apparatus according to the first embodiment of the present invention. FIG. 1 is a longitudinal cross-sectional view of the CVD apparatus, FIG. 2 a cross-sectional view of the CVD apparatus along the lines b—b of FIG. 1, and FIG. 3 a cross-sectional view of the CVD apparatus along the lines c—c of FIG. 1.

The CVD apparatus comprises a reaction chamber 1 having a circular cylindrical peripheral wall 1a, a susceptor plate 3 fixed in the reaction chamber 1 perpendicular to a central axis of the chamber for supporting a substrate 2 thereon and having an opening 3a at a substrate supporting region, and a reaction gas supply inlet 4 in the form of a shower nozzle for blowing a reaction gas with a carrier gas from above the substrate 2 supported on the susceptor plate 3. In the drawings, the substrate 2 is directly supported on the susceptor plate 3. However, it will be comprehended that the substrate 2 can be held and carried by a well known holder and the substrate 2 with the holder can be supported on the susceptor plate 3.

A source 2 is arranged below the susceptor plate 3 and an infrared light transparent window 6 is arranged between the source of infrared light 5 and the susceptor plate 3 for separating the reaction chamber 1 from an environment.

Also, a plurality of gas exits 7 are arranged circumferentially and equidistantly in the peripheral wall 1a in the reaction chamber 1 at a level just above the susceptor plate 3 so that the reaction gas is exhausted uniformly from the gas exits 7, i.e., the reaction gas does not flow in a single direction but flows radially and uniformly. Second gas supply inlets 8 and 8' for supplying a second gas, such as nitrogen or an inert gas, in the reaction chamber 1 are arranged between the susceptor plate 3 and the infrared light transparent window 6.

A second infrared light transparent window 13 is arranged between the susceptor plate 3 and the infrared light transparent window 6 parallel thereto. The second infrared light transparent window 13 has a central opening 13a in conformity with the central opening 3a of the susceptor plate 3. The second gas supply inlets 8 L7 and 8' are arranged in the peripheral wall 1a of the reaction chamber 1 between the infrared light transparent windows 6 and 13. The susceptor plate 3, and the infrared light transparent windows 6 and 13 can be made from a material having transparent properties to infrared light, for example, quartz.

A plurality of circumferentially spaced, preferably equidistantly arranged, gas passages 14 are arranged at the juncture of the susceptor plate 3 and the peripheral wall 1a of the reaction chamber 1 for allowing the second gas to flow from a portion of the reaction chamber 1 below the susceptor plate 3 to the gas exits 7 through the gas passages 14 and coordinated with the gas exits so that the flow of the first gas is less disturbed by the flow of the second gas. Therefore, the uniform flow of the first gas is maintained to obtain a thin film of average thickness to be deposited on the substrate 2.

To this end, it is preferable that the number of gas passages 14 be identical to the number of gas exits 7. In the first embodiment, three gas passages 14 are arranged in an alternating relationship with three gas exits 7.

Figure 4:
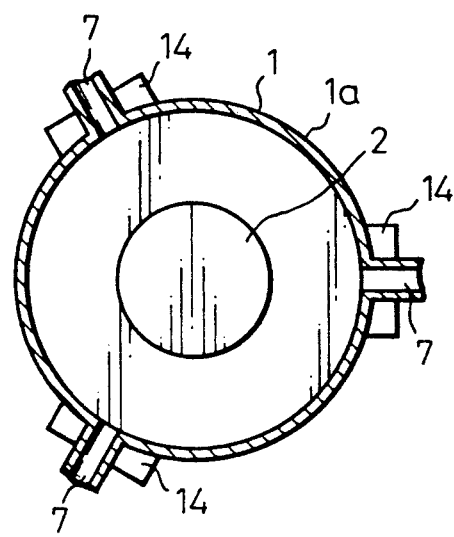
FIG. 4 is a view similar to FIG. 2 but showing the second embodiment of the present invention.

In the second embodiment shown in FIG. 4, three gas passages 14 are arranged in a superposed relationship with three gas exits 7.

Figure 9:
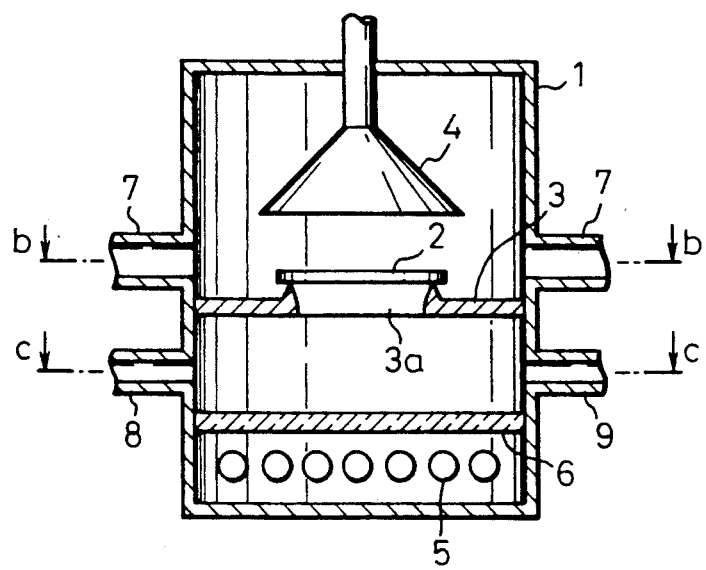
FIG. 9 is a longitudinal cross-sectional view of a conventional CVD apparatus.
Figure 10:
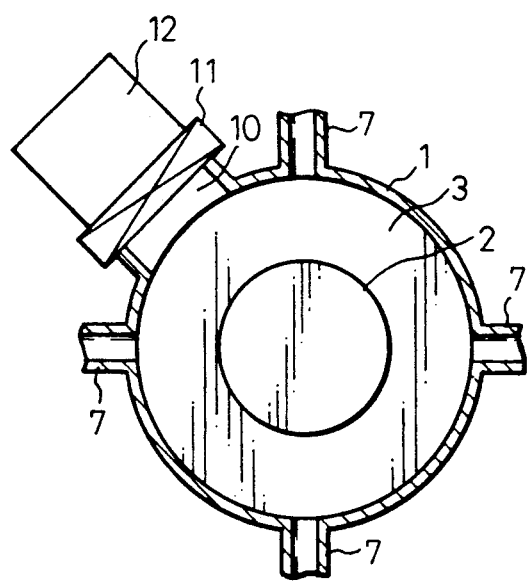
FIG. 10 is a cross-sectional view of the CVD apparatus along the lines b—b of FIG. 9.
Figure 11:
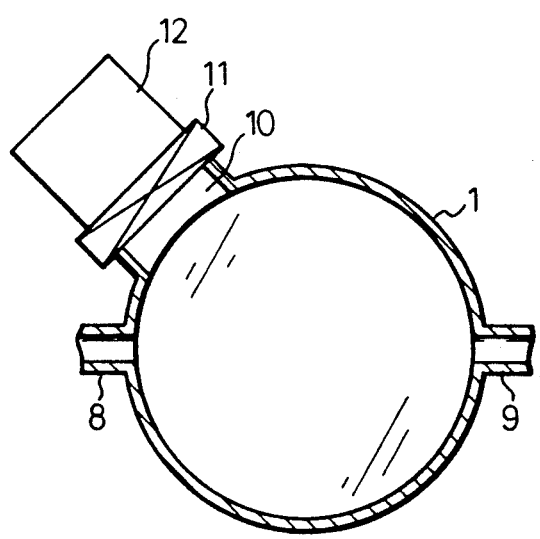
FIG. 11 is a cross-sectional view of the CVD apparatus along the lines c—c of FIG. 9.

Note, a second gas exit 9 is arranged at the same level of the second gas supply inlet 8 as in the prior art (FIG. 9), but such a second gas exit 9 is not provided in the present invention and accordingly the second gas is exhausted only through the gas passages 14.

In FIGS. 1 to 3, the gas passages 14 are formed by outwardly bulging portions of the peripheral wall 1a of the reaction chamber 1 while the susceptor plate 3 is a circular plate. One of the gas passages 14 is connected to a loadlock chamber 12 via a gate valve 11. Also, it is possible to use the gas passages 14 as a window for monitoring the reaction chamber.

In the case that the second infrared light transparent plate 13 with the central opening 13a is provided, the second gas flows inwardly from the second gas supply inlets 8 and 8' to the region of the central opening 13a and then outwardly from the region of the central opening 13a to the peripheral gas passages 14, as shown by the arrow A in FIG. 1. The flow of the second gas is thus uniformly distributed. Also, the flow of the second gas is directed upward toward the substrate 2 at the region of the central opening 13a, and blows the substrate 2 to prevent the reaction gas from leaking into possible gap between the substrate 2 and the susceptor plate 3.

When the thin film to be deposited on the substrate 2 is an oxide such as $Ta_2O_5$, it is possible to as or an inert gas. The reaction gas in this case may be pentaethoxytantalum $[Ta(OC_2H_5)_5]$.

Figure 5:
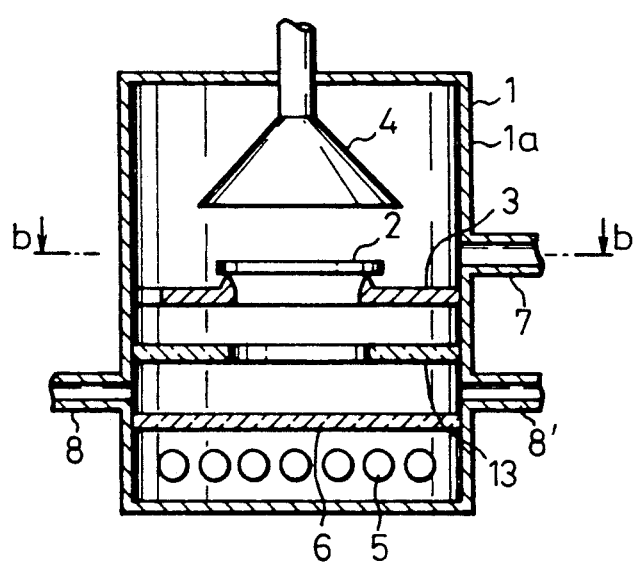
FIG. 5 is a longitudinal cross-sectional view of the CVD apparatus according to the third embodiment of the present invention.
Figure 6:
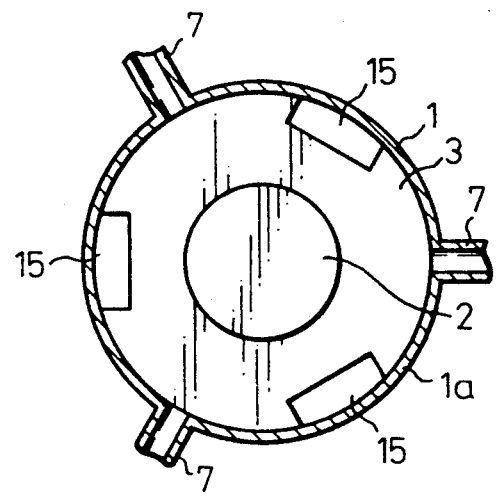
FIG. 6 is a cross-sectional view of the CVD apparatus along the lines b—b of FIG. 5.

FIGS. 5 and 6 show the third embodiment of the present invention, which includes elements similar to those of the first embodiment, except that the gas passages communicating between the supply inlets 8 and 8' and the gas exits 7 are formed by inwardly recessed portions 15 of the circular susceptor plate 3. The CVD apparatus of this embodiment functions similar to the previous embodiment.

Figure 7:
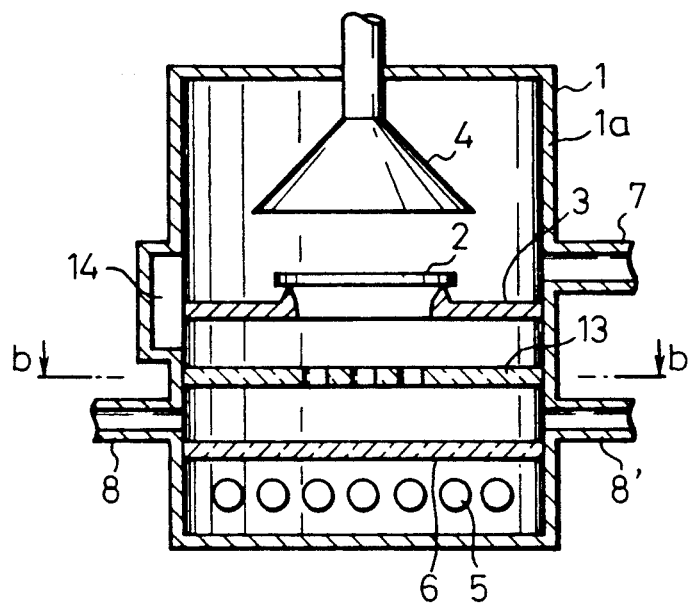
FIG. 7 is a longitudinal cross-sectional view of the CVD apparatus according to the fourth embodiment of the present invention.
Figure 8:
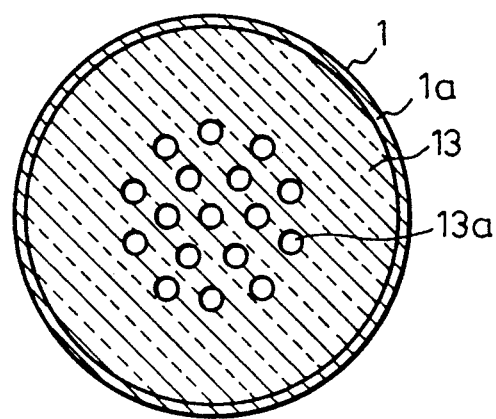
FIG. 8 is a cross-sectional view of the CVD apparatus along the lines b—b of FIG. 7.

FIGS. 7 and 8 show the fourth embodiment of the present invention, which includes elements similar to those of the first embodiment, except that the second infrared light transparent plate 13 has a plurality of small openings 13a in place of the former larger one. The CVD apparatus of this embodiment functions similar to the previous embodiment and the second gas may be further uniformly distributed by passing through the small openings 13a.

As explained above, it is possible to uniformly exhaust the second gas with the first reaction gas without the disturbance of the reaction gas to obtain a thin film of average thickness to be deposited on a substrate.

I claim:

1. A CVD apparatus comprising:
   a reaction chamber having an axis and a peripheral wall around the axis;
   a susceptor plate extending perpendicular to the axis in the reaction chamber and attached to the peripheral wall for supporting a substrate to be treated;
   first gas supply means for supplying a first gas in the reaction chamber from above the substrate supported on the susceptor plate;
   a source of infrared light for heating the substrate from below the substrate supported on the susceptor plate;
   an infrared light transparent window arranged between the source of infrared light and the susceptor plate for separating the reaction chamber from an environment;
   a plurality of circumferentially spaced gas exits arranged in the peripheral wall in the reaction chamber at a level so that the first gas is exhausted uniformly from the gas exits;
   second gas supply means for supplying a second gas in the reaction chamber below the susceptor plate; and
   a plurality of circumferentially spaced gas passages arranged at the juncture of the susceptor plate and the peripheral wall of the reaction chamber for allowing the second gas to flow from a portion of the reaction chamber below the susceptor plate to the gas exits through the gas passages and coordinated with the gas exits so that the flow of the first gas is/less disturbed by the flow of the second gas.

2. A CVD apparatus according to claim 1, wherein the level of the gas exits is just above the susceptor plate.

3. A CVD apparatus according to claim 1, wherein the susceptor plate has a central opening.

4. A CVD apparatus according to claim 1, wherein the second gas is exhausted only through the gas passages.

5. A CVD apparatus according to claim 1, wherein the gas passages are formed by outwardly bulging portions of the peripheral wall of the reaction chamber.

6. A CVD apparatus according to claim 1, wherein the gas passages are formed by inwardly recessed portions of the susceptor plate.

7. A CVD apparatus according to claim 1, wherein a further infrared light transparent plate is arranged between the infrared light transparent window and the susceptor plate; the further infrared light transparent plate having at least one opening at the central region thereof, and wherein the means supplying the second gas in the reaction chamber is formed in the peripheral wall of the reaction chamber at a level between the infrared light transparent plate and the infrared light transparent window, whereby the second gas flows inwardly from the means supplying the second gas to at least one opening and then outwardly from at least one opening to the gas passages above the infrared light transparent plate.

8. A CVD apparatus according to claim 1, wherein the number of gas passages is identical to the number of gas exits.

9. A CVD apparatus according to claim 8, wherein the gas passages are arranged in a superposed relationship with the gas exits.

10. A CVD apparatus according to claim 8, wherein the gas passages are arranged in an alternating relationship with the gas exits.

11. A CVD apparatus according to claim 1, wherein the second gas includes one of nitrogen gas, an inert gas or oxygen gas.

12. A CVD apparatus according to claim 1, wherein one of the gas passages is connected to a loadlock chamber.

* * * * *

UNITED STATES PATENT AND TRADEMARK OFFICE
CERTIFICATE OF CORRECTION

PATENT NO. : 5,188,058
DATED : February 23, 1993
INVENTOR(S) : Satoshi NAKAI

It is certified that error appears in the above-indentified patent and that said Letters Patent is hereby corrected as shown below:

Col. 3, line 34, change "wall la" to --wall 1a--;
line 47, after "source" insert --of infrared light 5 for heating the substrate--.

Col. 4, line 50, change "to as or" to --to use oxygen gas for the second gas, instead of nitrogen gas or--.

Signed and Sealed this

Thirty-first Day of May, 1994

Attest:

BRUCE LEHMAN

Attesting Officer      Commissioner of Patents and Trademarks